United States Patent
Khwa et al.

(10) Patent No.: US 12,057,164 B2
(45) Date of Patent: Aug. 6, 2024

(54) METHOD OF DATA ENCODING IN NON-VOLATILE MEMORIES

(71) Applicant: TAIWAN SEMICONDUCTOR MANUFACTURING COMPANY, LTD., Hsinchu (TW)

(72) Inventors: Win-San Khwa, Hsinchu (TW); Jui Jen Wu, Hsinchu (TW); Jen-Chieh Liu, Hsinchu (TW); Meng-Fan Chang, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 170 days.

(21) Appl. No.: 17/737,854

(22) Filed: May 5, 2022

(65) Prior Publication Data

US 2023/0010522 A1    Jan. 12, 2023

Related U.S. Application Data

(60) Provisional application No. 63/220,023, filed on Jul. 9, 2021.

(51) Int. Cl.
    *G11C 7/00*     (2006.01)
    *G11C 11/16*    (2006.01)
    *G11C 13/00*    (2006.01)

(52) U.S. Cl.
    CPC ...... *G11C 13/0069* (2013.01); *G11C 11/1673* (2013.01); *G11C 11/1675* (2013.01); *G11C 13/004* (2013.01); *G11C 13/0004* (2013.01)

(58) Field of Classification Search
    CPC ............ G11C 13/0069; G11C 11/1673; G11C 11/1675; G11C 13/004; G11C 13/0004; G11C 7/1006
    See application file for complete search history.

(56) References Cited

U.S. PATENT DOCUMENTS

| | | | |
|---|---|---|---|
| 2005/0094459 A1* | 5/2005 | Sesek | G06F 11/1008 714/E11.034 |
| 2014/0185386 A1 | 7/2014 | Yang | |
| 2014/0208014 A1* | 7/2014 | Voutilainen | H03M 7/3059 711/103 |
| 2016/0357632 A1* | 12/2016 | d'Abreu | G06F 11/1072 |
| 2017/0222719 A1 | 8/2017 | Haas et al. | |
| 2018/0314592 A1 | 11/2018 | Gulati et al. | |
| 2022/0406353 A1* | 12/2022 | Yano | G11C 11/005 |
| 2023/0028413 A1* | 1/2023 | Khwa | G11C 11/161 |
| 2023/0170021 A1* | 6/2023 | Yano | G11C 13/0038 |

FOREIGN PATENT DOCUMENTS

TW    202117608    5/2021

\* cited by examiner

*Primary Examiner* — Hien N Nguyen
(74) *Attorney, Agent, or Firm* — Hauptman Ham, LLP

(57) ABSTRACT

A method of storing a data into a memory storage having bit cells. The method includes identifying each of the binary one and the binary zero in the data as either a majority bit value or a minority bit value based on the probability of finding the binary one in the data or based on the probability of finding the binary zero in the data. In the method, a bit of the data is stored into the bit cell as the more preferred state if the bit of the data has the majority bit value, and a bit of the data is stored into the bit cell as the less preferred state if the bit of the data has the minority bit value.

20 Claims, 13 Drawing Sheets

|  | M[2] | M[1] | M[0] |
|---|---|---|---|
| n=-4 | 1 | 0 | 0 |
| n=-3 | 1 | 0 | 1 |
| n=-2 | 1 | 1 | 0 |
| n=-1 | 1 | 1 | 1 |
| n=0 | 0 | 0 | 0 |
| n=1 | 0 | 0 | 1 |
| n=2 | 0 | 1 | 0 |
| n=3 | 0 | 1 | 1 |

FIG. 4

$$C = \begin{bmatrix} 1 & 0 & 0 \\ 1 & 0 & 1 \\ 1 & 1 & 0 \\ 1 & 1 & 1 \\ 0 & 0 & 0 \\ 0 & 0 & 1 \\ 0 & 1 & 0 \\ 0 & 1 & 1 \end{bmatrix}$$

FIG. 5A $$\begin{bmatrix} M[2] \\ M[1] \\ M[0] \end{bmatrix} = \begin{bmatrix} 1 & 1 & 1 & 1 & 0 & 0 & 0 & 0 \\ 0 & 0 & 1 & 1 & 0 & 0 & 1 & 1 \\ 0 & 1 & 0 & 1 & 0 & 1 & 0 & 1 \end{bmatrix} \cdot X$$

FIG. 5B $x(n=-4) = \begin{bmatrix} 1 & 0 & 0 & 0 & 0 & 0 & 0 & 0 \end{bmatrix}$ $x(n=-3) = \begin{bmatrix} 0 & 1 & 0 & 0 & 0 & 0 & 0 & 0 \end{bmatrix}$ $x(n=-2) = \begin{bmatrix} 0 & 0 & 1 & 0 & 0 & 0 & 0 & 0 \end{bmatrix}$ $x(n=-1) = \begin{bmatrix} 0 & 0 & 0 & 1 & 0 & 0 & 0 & 0 \end{bmatrix}$ $x(n=0) = \begin{bmatrix} 1 & 0 & 0 & 1 & 0 & 0 & 0 \end{bmatrix}$ $x(n=1) = \begin{bmatrix} 0 & 0 & 0 & 0 & 1 & 0 & 0 \end{bmatrix}$ $x(n=2) = \begin{bmatrix} 0 & 0 & 0 & 0 & 0 & 1 & 0 \end{bmatrix}$ $x(n=3) = \begin{bmatrix} 0 & 0 & 0 & 0 & 0 & 0 & 1 \end{bmatrix}$

FIG. 5C $$E(X) = \begin{bmatrix} p(n=-4) \\ p(n=-3) \\ p(n=-2) \\ p(n=-1) \\ p(n=0) \\ p(n=1) \\ p(n=2) \\ p(n=3) \end{bmatrix}$$

FIG. 5D $$\begin{bmatrix} b[2] \\ b[1] \\ b[0] \end{bmatrix} = \begin{bmatrix} 1 & 1 & 1 & 1 & 0 & 0 & 0 & 0 \\ 0 & 0 & 1 & 1 & 0 & 0 & 1 & 1 \\ 0 & 1 & 0 & 1 & 0 & 1 & 0 & 1 \end{bmatrix} \begin{bmatrix} p(n=-4) \\ p(n=-3) \\ p(n=-2) \\ p(n=-1) \\ p(n=0) \\ p(n=1) \\ p(n=2) \\ p(n=3) \end{bmatrix}$$

FIG. 6A $$\begin{bmatrix} b[2] \\ b[1] \\ b[0] \end{bmatrix} = \begin{bmatrix} p(n=-4)+p(n=-3)+p(n=-2)+p(n=-1) \\ p(n=-2)+p(n=-1)+p(n=2)+p(n=3) \\ p(n=-3)+p(n=-1)+p(n=1)+p(n=3) \end{bmatrix}$$

FIG. 6B $$p \text{ (binary one)} = (1/3) \, [\, 1, 1, 1 \,] \begin{bmatrix} b[2] \\ b[1] \\ b[0] \end{bmatrix} = (1/3) \, I_3 \cdot C \cdot p_8(n)$$

FIG. 7A $$I_3 = [\, 1, 1, 1 \,]$$

FIG. 7B $$p_8(n) = \begin{bmatrix} p(n=-4) \\ p(n=-3) \\ p(n=-2) \\ p(n=-1) \\ p(n=0) \\ p(n=1) \\ p(n=2) \\ p(n=3) \end{bmatrix} \quad [\, p(n=-4), p(n=-3), \cdots, p(n=3) \,]^T$$

FIG. 7C $$p(\text{binary one}) = (1/N)\, I_N \cdot C^T \cdot p_M(u)$$

FIG. 8A $$I_N = [\underbrace{1, 1, \cdots, 1}_{N}]$$

FIG. 8B $$p_M(u) = [\underbrace{p(u=u_1), p(u=u_2), \cdots, p(u=u_M)}_{M}]^T$$

FIG. 8C

METHOD OF DATA ENCODING IN NON-VOLATILE MEMORIES

PRIORITY CLAIM AND CROSS-REFERENCE

The present application claims the priority of U.S. Provisional Application No. 63/220,023, filed Jul. 9, 2021, which is incorporated herein by reference in its entirety.

BACKGROUND

In some non-volatile memory devices, each bit of information is stored in a memory element that has two states. Examples of non-volatile memory devices include PCRAM (Phase Change Random Access Memory) devices, RRAM (resistive Random Access Memory) devices, and MRAM (Magnetoresistive Random Access Memory) devices. The two states of the memory element may have different retention failure rates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a coding table, in accordance with some embodiments.

FIG. 5A is an equation of a coding matrix corresponding to the coding table of FIG. 4, in accordance with some embodiments.

FIG. 5B is an equation of mapping a column vector representing integers to the column vector representing the bits in coded integers, in accordance with some embodiments.

FIG. 5C are equations for defining the possible column vector values of the column vector representing integers, in accordance with some embodiments.

FIG. 5D is the expected value expressed in matrix form, in accordance with some embodiments.

FIG. 6A is an equation for calculating the probability of finding the binary one in the bits of the coded data, in accordance with some embodiments.

FIG. 6B is an equation for calculating the probability of finding the binary one in the bits of the coded data, after finishing the matrix multiplication in FIG. 6A, in accordance with some embodiments.

FIG. 7A is an equation for calculating the probability p(binary one), in accordance with some embodiments.

FIG. 7B-7C are the definitions of the matrixes in FIG. 7A, in accordance with some embodiments.

FIG. 8A is an equation for calculating the probability p(binary one), in accordance with some embodiments.

FIG. 8B-8C are the definitions of the matrixes in FIG. 8A, in accordance with some embodiments.

DETAILED DESCRIPTION

Figure 1A:
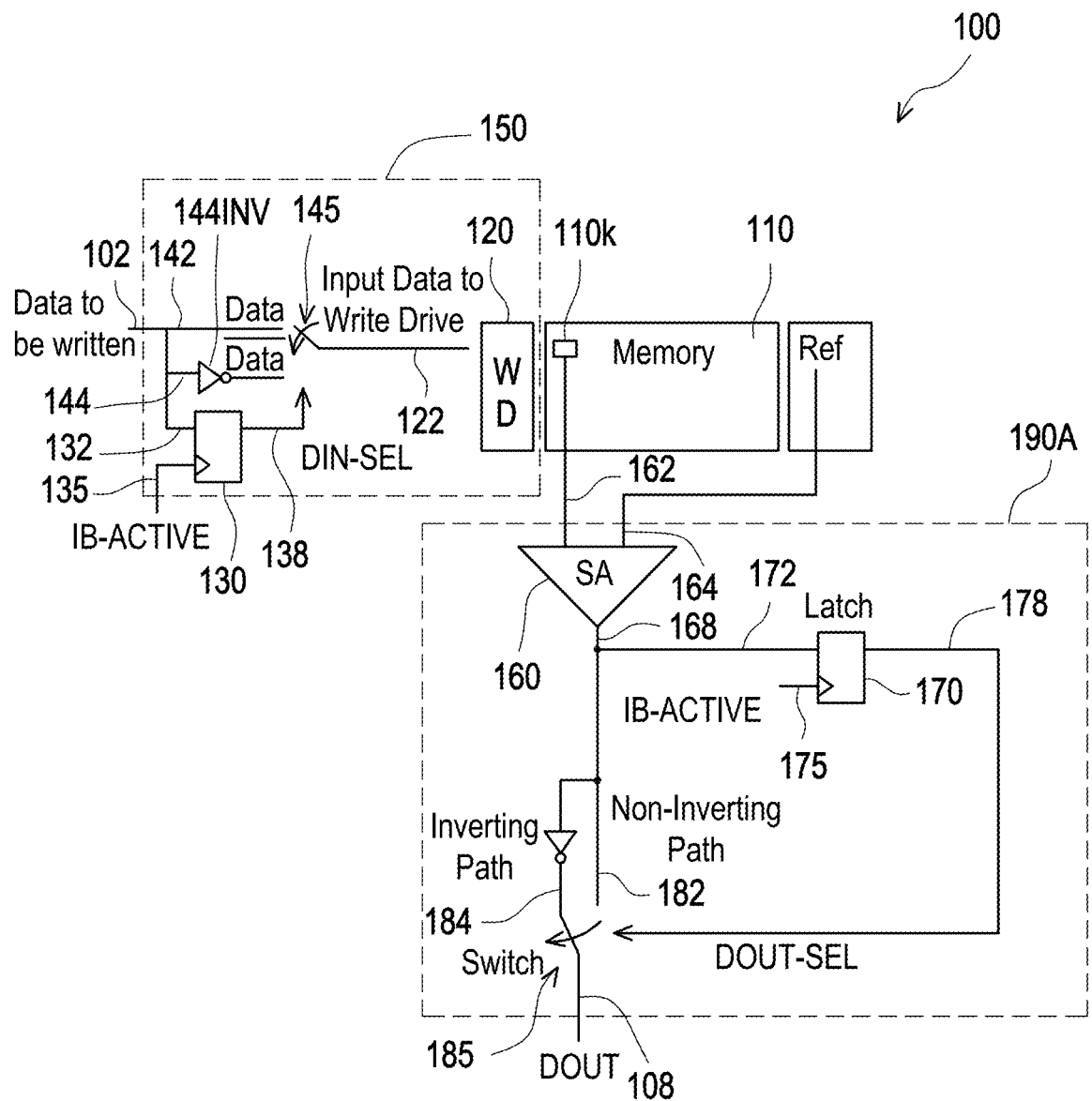
FIGS. 1A-1B are schematic diagrams of integrated circuits, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, when data is stored into a memory storage, how to store each bit of the data in a bit cell of the memory storage influences the data reliability, because the bit cell has a more preferred state and a less preferred state. The more preferred state is less susceptible to retention errors, as compared with the less preferred state. In some embodiments, each of the binary one and the binary zero in the data is identified as either a majority bit value or a minority bit value. A probability of finding a majority bit value in the data is larger than a probability of finding a minority bit value in the data. If a bit of the data has the majority bit value, then the bit of the data is stored into the bit cell with the more preferred state; on the other hand, if a bit of the data has the minority bit value, then the bit of the data is stored into the bit cell with the less preferred state. In some embodiments, a reliability indicator is used to indicate whether the binary one or the binary zero is the majority bit value, or conversely used to indicate whether the binary one or the binary zero is the minority bit value. In some embodiments, an integrated circuit relies upon the reliability indicator to write a data into the memory storage and to read out the stored data from the memory storage.

In some embodiments, the bit cells in the memory storage are based on Phase Change Random Access Memory (PCRAM) devices. In some PCRAM devices, the change of the conductivity of a phase-changing material is used to store one bit of information. For example, in some embodiments, the conductivity of a phase-changing material depends upon whether a phase-changing material is in an amorphous phase or a crystalline phase, and the different conductivity values of the phase-changing material allows the storage of one bit of information. In some embodiments, the higher-resistance state corresponds to the amorphous phase, while the lower-resistance state corresponds to the crystalline phase. Because the drift of resistance value depends on the amorphous volume, the higher-resistance state is more susceptible to retention errors. When the bit cells in the memory storage are based on PCRAM devices, the lower-resistance state of a bit cell is the more preferred state, and the higher-resistance state of a bit cell is the less preferred state.

In some embodiments, the bit cells in the memory storage are based on filament type Resistive Random Access Memory (RRAM) devices. In some filament type RRAM devices, the change of the resistance of a specially formulated dielectric material is used to store one bit of information. For example, in some embodiments, the forming of filaments changes the conductivity of the dielectric material in a capacitor, and the controlled formation and destruction of filaments allows the storage of one bit of information. In some embodiments, data retention failure is mainly caused by the rupture of the conducting filaments; as such, the lower-resistance state is more susceptible to retention errors, as compared with the higher-resistance state. When the bit cells in the memory storage are based on filament type RRAM devices, the higher-resistance state of a bit cell is the more preferred state, and the lower-resistance state of a bit cell is the less preferred state.

In some embodiments, the bit cells in the memory storage are based on Magnetoresistive Random Access Memory (MRAM) devices. In some MRAM devices, the relative orientation of the magnetization in the two plates is used to store one bit of information. For example, in some embodiments, if the two plates have the same magnetization alignment, the resultant low resistance state between the two plates is designated as a first storage state, and if the alignment is antiparallel, the resultant high resistance state between the two plates is designated as a second storage state. In some embodiments, the relative orientation of the magnetization is programmed based on the direction of the program current. Because the read current creates some disturbance on the magnetization in the two plates, the magnetization state that is programmed with a first program current in the same direction of the read current generally is subject to a smaller magnetization disturbance than the magnetization state that is programmed with a second program current in the opposite direction of the read current; consequently, the magnetization state that is programmed with the second program current is more susceptible to retention errors. When the bit cells in the memory storage are based on MRAM devices, the magnetization state programmed with a program current in the same direction of the read current is the more preferred state, and the magnetization state programmed with a program current in the opposite direction of the read current is the less preferred state.

When a data having multiple bits is stored in the bit cells of the memory storage, the method of encoding the data for storage may influence the data reliability, if the two states for storing one bit of information in a bit cell have different retention errors. When the two states of a bit cell include a more preferred state and a less preferred state, if the number of binary one bits in the data is different from the number of binary zero bits in the data when the data is coded with multiple bits, the data reliability depends upon how to select which one of the two states for storing a binary one bit and which one of the two states for storing a binary zero bit. Specifically, if the number of binary one bits in the data is larger than the number of binary zero bits in the data, an implementation of using the more preferred states to store the binary one bits and using the less preferred states to store the binary zero bits generally has improved data reliability, as compared with an alternative implementation in which the more preferred states are used to store the binary zero bits and the less preferred states are used to store the binary one bits. In contrast, if the number of binary one bits in the data is smaller than the number of binary zero bits in the data, an implementation of using the more preferred states to store the binary zero bits and using the less preferred states to store the binary one bits generally has improved data reliability, as compared with an alternative implementation in which the more preferred states are used to store the binary one bits and the less preferred states are used to store the binary zero bits.

Figure 1B:
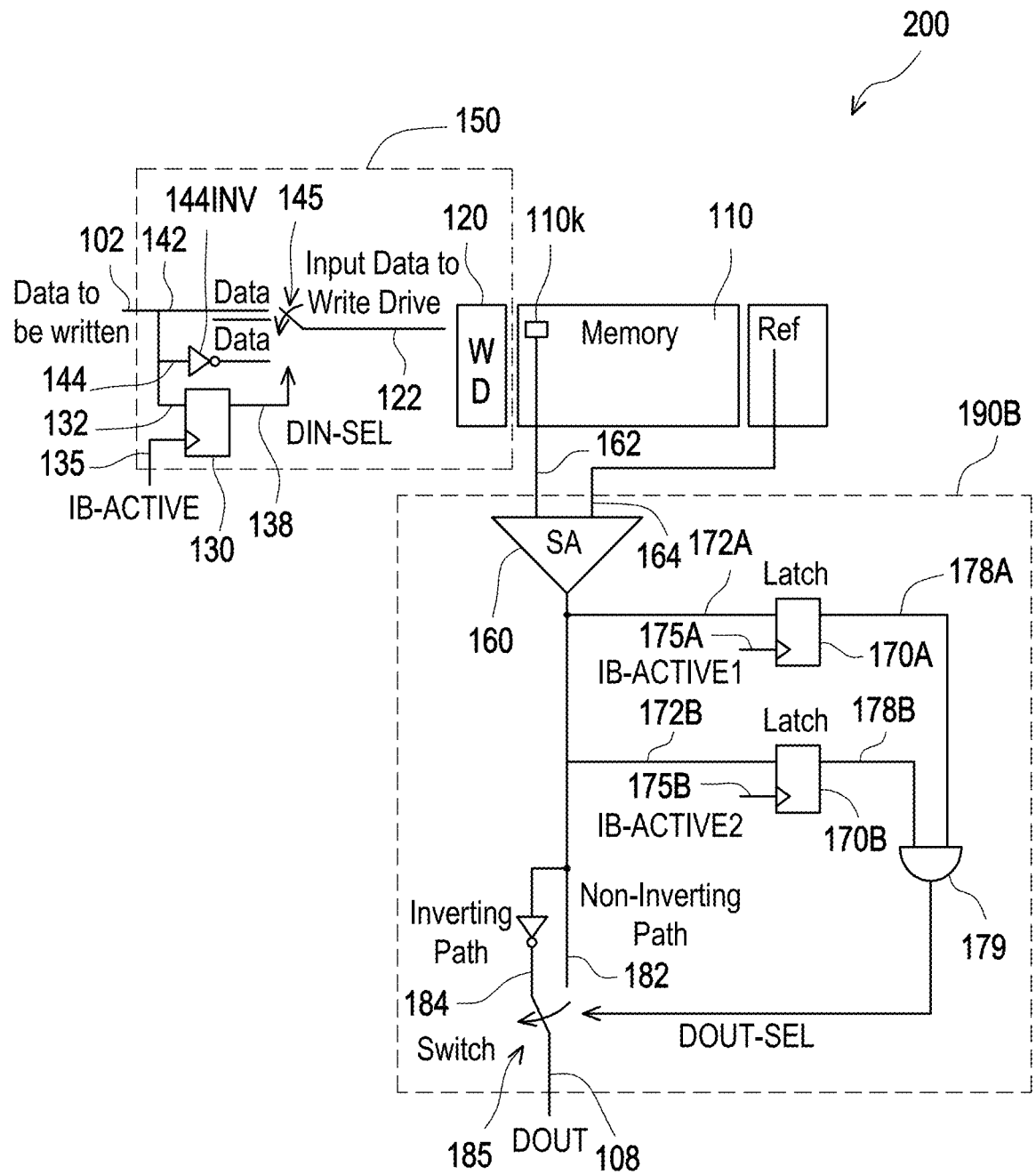

FIGS. 1A-1B are schematic diagrams of integrated circuit 100 and 200, in accordance with some embodiments. Each of the integrated circuits 100 and 200 includes a memory storage 110 having bit cells, a write circuit 150 connected with the memory storage 110, and a read circuit (190A or 190B) connected with the memory storage 110. One of the bit cells, the bit cell 110k, is shown in the figure. Other bit cells are not explicitly shown in FIGS. 1A-1B. In some embodiments, the bit cells in the memory storage 110 are arranged in one or more one-dimensional arrays. In some embodiments, the bit cells in the memory storage 110 are arranged in one or more two-dimensional arrays. In FIGS. 1A-1B, a bit cell has a more preferred state and a less preferred state. Example storage devices for implementing the bit cells include PCRAM devices, RRAM devices, and MRAM devices.

In FIGS. 1A-1B, the write circuit 150 includes a write driver 120, a write path switch 145, a first write path 142, a second write path 144, a write terminal 102, and a reliability indicator latch 130. The first write path 142 is coupled between the write terminal 102 and the write path switch 145. The second write path 144 having an inverter 144INV is coupled between the write terminal 102 and the write path switch 145. The write driver 120 has an input 122 that is connected to the write path switch 145.

In FIGS. 1A-1B, the read circuit (190A or 190B) includes a sense amplifier 160, a read path switch 185, a first read path 182, a second read path 184, and a read terminal 108. The read circuit 190A in FIG. 1A further includes a reliability indicator latch 170, while the read circuit 190B in FIG. 1B further includes two reliability indicator latches 170A and 170B and an AND-gate 179. The first read path 182 is coupled between the sense amplifier 160 and the read path switch 185. The second read path 184 having an inverter 184INV is coupled between the sense amplifier 160 and the read path switch 185. In FIG. 1A, the reliability indicator latch 170 has an input 172 connected to the output 168 of the sense amplifier 160. In FIG. 1B, each of the reliability indicator latches 170A and 170B has a corresponding input 172A or 172B connected to the output 168 of the sense amplifier 160.

In FIG. 1A, the write driver 120 has the input 122 configured to receive an input data from the write terminal 102 through either the first write path 142 or the second write path 144. If the write path switch 145 is at a first connection state, the data at the write terminal 102 is transmitted to the input 122 of the write driver 120 as the input data through the first write path 142. If the write path switch 145 is at a second connection state, the data at the write terminal 102 is transmitted to the input 122 of the write driver 120 as the input data through the second write path 144. If the input data is received through the first write path 142, the input data at the input 122 of the write driver 120 is equal to the data at the write terminal 102. If the input data is received through the second write path 144, the input data at the input 122 of the write driver 120 is equal to a bitwise complement of the data at the write terminal 102. In some embodiments, the first write path 142 is implemented as an electric conductor connected between the input 122 of the write driver 120 and the write terminal 102, and the second write path 144 is implemented with the inverter 144INV operationally connected between the input 122 of the write driver 120 and the write terminal 102. Other implementations of the first write path 142 and the second write path 144 are within the contemplated scope of the present disclosure.

Whether the write path switch 145 is set at the first connection state or at the second connection state is determined by a reliability indicator. In some embodiments, the reliability indicator is represented by a one bit indicator signal which is received from the write terminal 102 by the reliability indicator latch 130. The one bit indicator signal at the input 132 of the reliability indicator latch 130 is latched during a time interval as determined by an IB-ACTIVE signal received at the terminal 135 of the reliability indicator latch 130. The latch output signal DIN-SEL at the output terminal of the reliability indicator latch 130 is used to control the write path switch 145.

In some embodiments, the reliability indicator is set based on a majority bit value in the data or based on a minority bit value in the data. If the number of binary one bits in the data at the write terminal 102 is larger than the number of binary zero bits in the data at the write terminal 102, then the binary one is the majority bit value and the binary zero is the minority bit value. Conversely, if the number of binary one bits in the data at the write terminal 102 is smaller than the number of binary zero bits in the data at the write terminal 102, then the binary zero is the majority bit value and the binary one is the minority bit value. In some embodiments, the reliability indicator is set to a first value if the binary one is the majority bit value and the binary zero is the minority bit value, and the reliability indicator is set to a second value different from the first value if the binary zero is the majority bit value and the binary one is the minority value. In some embodiments, the reliability indicator is implemented as one indicator bit which is either the binary one or the binary zero. In a first example implementation, the indicator bit is set to the binary one if the binary one is the majority bit value, and the indicator bit is set to the binary zero if the binary zero is the majority bit value. In a second example implementation, the indicator bit is set to the binary zero if the binary one is the majority bit value, and the indicator bit is set to the binary one if the binary zero is the majority bit value.

Figure 2A:
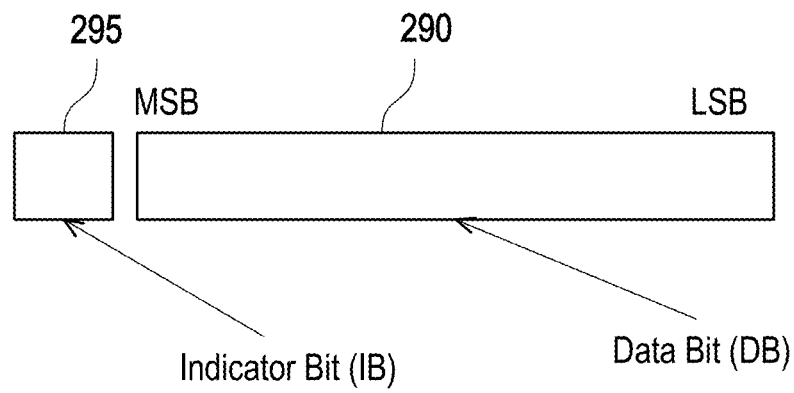
FIG. 2A is a schematic diagram of a data and an indicator bit, in accordance with some embodiments.

In some embodiments, the indicator bit associated with a data is stored in the memory storage 110 along with the data. FIG. 2A is a schematic diagram of a data 290 in the memory storage 110 and the indicator bit 295 associated with the data 290, in accordance with some embodiments. In FIG. 2A, the individual bit of the data 290 is stored from the Most Significant Bit ("MSB") to the Least Significant Bit ("LSB"). The indicator bit 295 is stored in the memory storage 110 as a header before the MSB of the data 290. One of the bit cells in the memory storage 110 is used as an indicator storage for storing the indicator bit 295. When the indicator bit 295 and the data 290 are read out from the memory storage 110 as a bit stream, if the data 290 is read in the order from the MSB to the LSB, the indicator bit 295 arrives before the MSB of the data 290, while the LSB of the data 290 arrives last in the bit stream. In some alterative embodiments, the indicator bit 295 is stored in the memory storage 110 as a footer after the LSB of the data 290. When the indicator bit 295 and the data 290 are read out from the memory storage 110 as a bit stream, if the data 290 is read in the order from the MSN to the LSB, the MSB of the data 290 arrives first, while the indicator bit 295 arrives last after the LSB of the data 290. In some embodiments, the data 290 and the indicator bit 295 in the memory storage 110 are read out with a sense amplifier.

In FIG. 1A, the sense amplifier 160 is configured to detect one or more stored bits in the memory storage 110. A first input 162 of the sense amplifier 160 is connected to the bit cell 110k, and a second input 164 of the sense amplifier 160 is connected to a reference voltage REF. The sense amplifier 160 is configured to output a bit read value to the read terminal 108 through either the first read path 182 or the second read path 184 as determined by the connection state of a read path switch 185. If the read path switch 185 is at a first connection state, the bit read value at the read terminal 108 is received from the output 168 of the sense amplifier 160 through the first read path 182, and the bit read value through the first read path 182 has a same binary value as the stored bit. If the read path switch 185 is at a second connection state, the bit read value at the read terminal 108 is received from the output 168 of the sense amplifier 160 through the second read path 184, and the bit read value through the second read path 184 has a complement binary value as the stored bit. In some embodiments, the first read path 182 is implemented as an electric conductor connected between the output 168 of the sense amplifier 160 and the read terminal 108, and the second read path 184 is implemented with the inverter 184INV operationally connected between the output 168 of the sense amplifier 160 and the read terminal 108. Other implementations of the first read path 182 and the second read path 184 are within the contemplated scope of the present disclosure.

Whether the read path switch 185 is set at the first connection state or at the second connection state is determined by a reliability indicator. In some embodiments, the reliability indicator is represented by the indicator bit 295 in FIG. 2A. When the indicator bit 295 and the data 290 are read out from the memory storage 110 as a bit stream by the sense amplifier 160, the indicator bit 295 at the output 168 of the sense amplifier 160 is received at the input 172 of the reliability indicator latch 170. During a time interval as determined by an IB-ACTIVE signal received at the terminal 175 of the reliability indicator latch 170, the bit value of the indicator bit 295 is latched into the reliability indicator latch 170. The latch output signal DOUT-SEL at the output terminal 178 of the reliability indicator latch 170 is used to control the read path switch 185.

In FIG. 1A, during the writing process when the original data at the write terminal 102 is written into the memory storage 110 as a stored data, the reliability indicator is used to determine whether the stored data is equal to the original data or equal to a bitwise complement of the original data. During the read process when the stored data is readout from the memory storage 110 as an output data at the read terminal 108, the reliability indicator is used to determine whether the output data is equal to the stored data or equal to a bitwise complement of the stored data. If the reliability indicator during the writing process is the same as the reliability indicator during the read process, the output data at the read terminal 108 is the same as the original data at the write terminal 102. On the other hand, if the reliability indicator for the original data during the writing process and the reliability indicator for the output data during the read process are not consistent, the output data can be erroneously changed from the original data. Consequently, the data reliability for the data stored with the integrated circuit 100 in FIG. 1A depends upon the reliability of the reliability indicator. In some embodiments, the reliability indicator is implemented as an indicator bit 295 stored in a bit cell which is less susceptible to retention errors, as compared with the bit cells for the data bits in the data 290. In some embodiments, the reliability indicator associated with a data is stored in a separate memory storage which has better reliability than the memory storage 110 for storing the data bits of the data. In still some embodiments, the reliability indicator is implemented with two indicator bits. A reliability indicator implemented with two indicator bits generally is less susceptible to retention errors, as compared with a reliability indicator implemented with only one indicator bit.

Figure 2B:
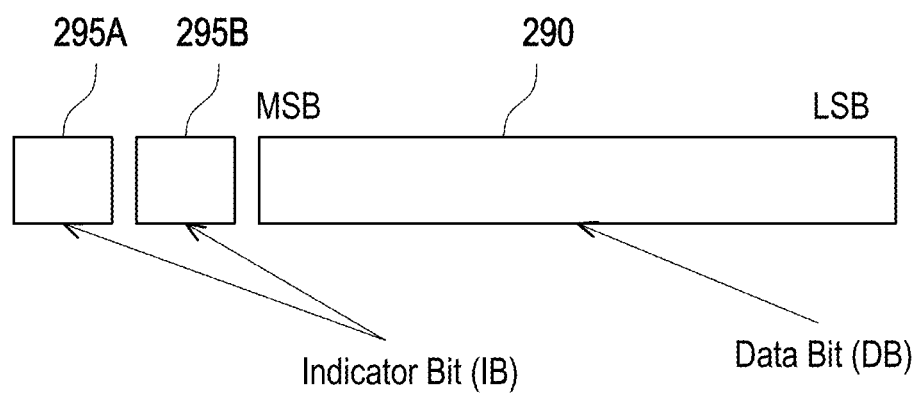
FIG. 2B is a schematic diagram of a data and two indicator bits, in accordance with some embodiments.

FIG. 2B is a schematic diagram of a data 290 in the memory storage 110 and the two indicator bits 295A and 295B associated with the data 290, in accordance with some embodiments. In FIG. 2B, the individual bit of the data 290 is stored from the Most Significant Bit ("MSB") to the Least Significant Bit ("LSB"). The indicator bits 295A and 295B are stored in the memory storage 110 as a header before the MSB of the data 290. Two of the bit cells in the memory storage 110 is used as the indicator storage for indicator bits 295A and 295B. When the indicator bits 295A and 295B and the data 290 are read out from the memory storage 110 as a bit stream, if the data 290 is read in the order from the MSB to the LSB, the indicator bits 295A and 295B arrive sequentially before the MSB of the data 290, while the LSB of the data 290 arrives last in the bit stream. In some alterative embodiments, the indicator bits 295A and 295B are stored in the memory storage 110 as a footer after the LSB of the data 290. When the indicator bits 295A and 295B and the data 290 are read out from the memory storage 110 as a bit stream, if the data 290 is read in the order from the MSB to the LSB, the MSB of the data 290 arrives first, while the indicator bits 295A and 295B arrive last sequentially after the LSB of the data 290. In some embodiments, the data 290 and the indicator bits 295A and 295B in the memory storage 110 are read out with a sense amplifier.

The integrated circuit 200 in FIG. 1B includes the read circuit 190B configured to read out data in the memory storage based upon a reliability indicator having two indicator bits, such as the indicator bits 295A and 295B in FIG. 2B. In the read circuit 190B, the input 172A of the reliability indicator latch 170A and the input 172B of the reliability indicator latch 170B are connected to the output 168 of the sense amplifier 160. The terminal 175A of the reliability indicator latch 170A is configured to receive an IB-ACTIVE1 signal, and the terminal 175B of the reliability indicator latch 170B is configured to receive an IB-ACTIVE2 signal. The output terminal 178A of the reliability indicator latch 170A is connected to a first input of the AND-gate 179, and the output terminal 178B of the reliability indicator latch 170B is connected to a second input of the AND-gate 179. The output signal DOUT-SEL at the output of the AND-gate 179 is used to control the read path switch 185.

In FIG. 1B, whether the output 168 of the sense amplifier 160 is coupled to the read terminal 108 through the first read path 182 or through the second read path 184 is determined based on the value of two indicator bits 295A and 295B as shown in FIG. 2B. When the indicator bits 295A and 295B and the data 290 are read out from the memory storage 110 as a bit stream by the sense amplifier 160, the indicator bits 295A and 295B at the output 168 of the sense amplifier 160 are correspondingly received at the input 172A of the reliability indicator latch 170A and at the input 172B of the reliability indicator latch 170B. During a time interval as determined by an IB-ACTIVE1 signal received at the terminal 175A of the reliability indicator latch 170A, the bit value of the indicator bit 295A is latched into the reliability indicator latch 170A. During a time interval as determined by an IB-ACTIVE2 signal received at the terminal 175B of the reliability indicator latch 170B, the bit value of the indicator bit 295B is latched into the reliability indicator latch 170B. The latched bit value of the indicator bit 295A at the output terminal 178A of the reliability indicator latch 170A is coupled to the first input of the AND-gate 179, and the latched bit value of the indicator bit 295B at the output terminal 178B of the reliability indicator latch 170B is coupled to the second input of the AND-gate 179.

In some embodiments, if the binary value of the indicator bit 295A and the binary value of the indicator bit 295B are both equal to logic one, the output signal DOUT-SEL at the output of the AND-gate 179 sets the read path switch 185 to a first connection state, and alternatively, if one or both of the binary values of the indicators bit 295A and 295B are equal to logic zero, the output signal DOUT-SEL at the output of the AND-gate 179 sets the read path switch 185 to a second connection state. In some alternative embodiments, if the binary value of the indicator bit 295A and the binary value of the indicator bit 295B are both equal to logic zero, the output signal DOUT-SEL at the output of the AND-gate 179 sets the read path switch 185 to a first connection state, and alternatively, if one or both of the binary values of the indicators bit 295A and 295B are equal to logic one, the output signal DOUT-SEL at the output of the AND-gate 179 sets the read path switch 185 to a second connection state.

Figure 3:
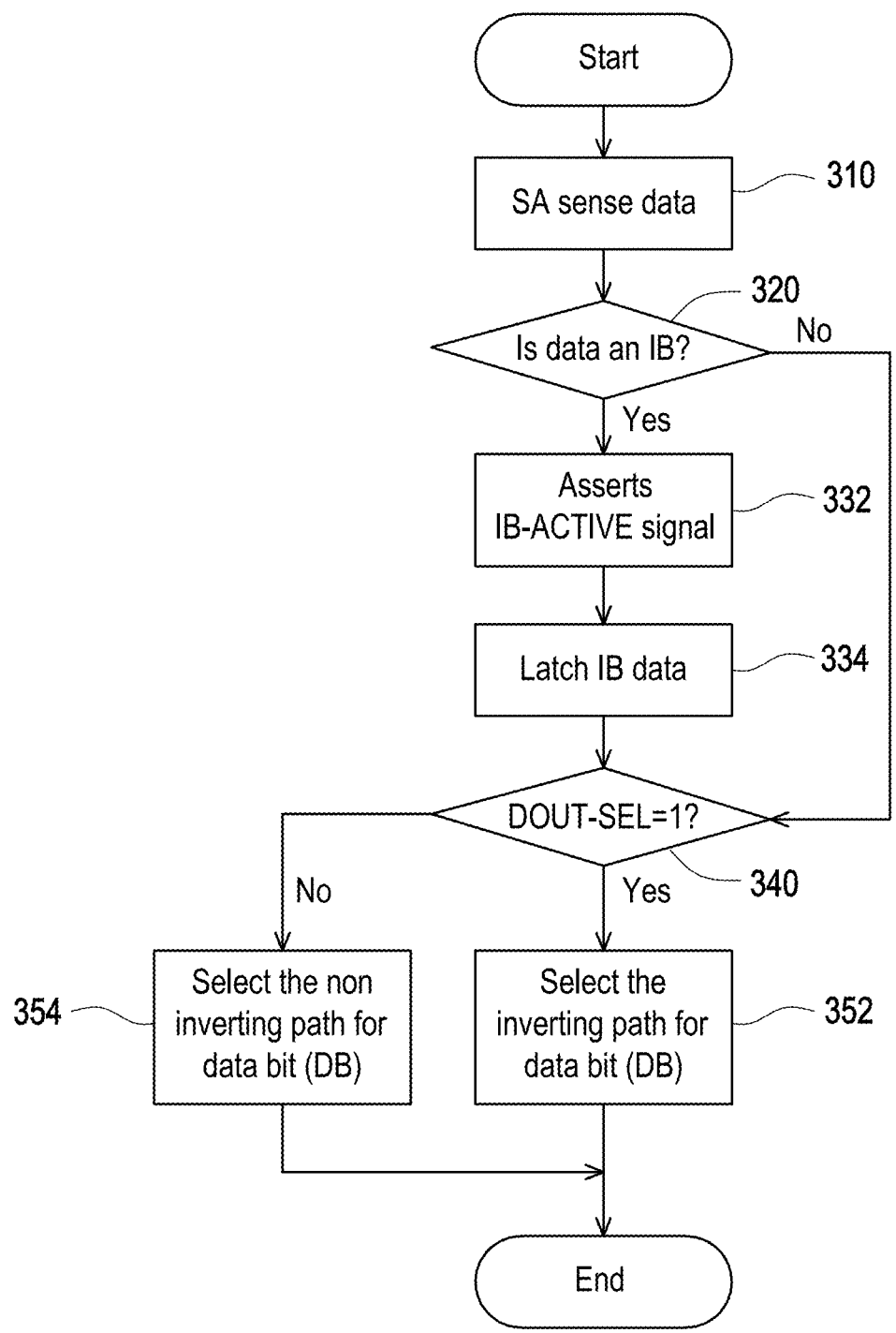
FIG. 3 is a flowchart of a method of reading the stored bits in the memory storage, in accordance with some embodiments.

FIG. 3 is a flowchart of a method 300 of reading the stored bits in the memory storage 110 of FIG. 1A or FIG. 1B. The sequence in which the operations of method 300 are depicted in FIG. 3 is for illustration only; the operations of method 300 are capable of being executed in sequences that differ from that depicted in FIG. 3. It is understood that additional operations may be performed before, during, and/or after the method 300 depicted in FIG. 3, and that other processes may only be briefly described herein.

In operation 310 of method 300, data is sensed with a sense amplifier. In the example embodiments of FIG. 1A and FIG. 1B, one or more stored bits in the memory storage 110 are sensed with the sense amplifier 160. In operation 320 of method 300, one or more bits in the data sensed from the memory storage 110 are determined based on addresses of the bit cells for storing the bits. If the one or more bits in the data are not one of the indicator bits, the process proceeds to operation 340. Conversely, if the one or more bits in the data include at least one indicator bit, the process proceeds to operation 332 and subsequently to operation 334.

In operation 332 of method 300, one or more IB-ACTIVE signals are asserted. In operation 334 of method 300, one or more indicator bits are latched. In the example embodiment of FIG. 1A, the IB-ACTIVE signal is applied to the terminal 175 of the reliability indicator latch 170, and the value of the indicator bit 295 is latched into the reliability indicator latch 170. In the example embodiment of FIG. 1B, the indicator bit active signals IB-ACTIVE1 and IB-ACTIVE2 are correspondingly applied to the terminal 175A of the reliability indicator latch 170A and the terminal 175B of the reliability indicator latch 170B, and the values of the indicator bits 295A and 295B are correspondingly latched into the reliability indicator latches 170A and 170B. After operation 324, the process proceeds to operation 340.

In operation 340 of method 300, the signal DOUT-SEL related to the latch output signal is applied to the read path switch. In some embodiments, if the signal DOUT-SEL is equal to binary one, the inverting path for the data bits is selected in operation 352, and conversely, if the signal DOUT-SEL is not equal to binary one, the non-inverting path for the data bits is selected in operation 354. In some alternative embodiments, if the signal DOUT-SEL is equal to binary zero, the inverting path for the data bits is selected in operation 352, and conversely, if the signal DOUT-SEL is not equal to binary zero, the non-inverting path for the data bits is selected in operation 354. In the example embodiments of FIG. 1A and FIG. 1B, the signal DOUT-SEL is applied to the read path switch 185 to select either the first read path 182 or the second read path 184 as the signal connection between the output 168 of the sense amplifier 160 and the read terminal 108.

In FIG. 1A and FIG. 1B, during the writing process when a data at the write terminal 102 is written into the memory storage 110 as a stored data, the reliability indicator is set based on a majority bit value in the data or based on a minority bit value in the data. In some embodiments, the majority bit value and the minority bit value are determined based on a probability of finding a binary one in the data or based on a probability of finding a binary zero in the data. As each of the binary one and the binary zero is either the majority bit value or the minority bit value, once the majority bit value is determined, the minority bit value is automatically determined, and vice versa. In some embodiments, the data at the write terminal 102 belongs to a data set which has a data distribution that is known, and either the probability of finding the binary one in the data or the probability of finding the binary zero in the data are determined based upon the data distribution of the data set. As the sum of the probability of finding the binary one and the probability of finding the binary zero is equal to one, after the probability of finding the binary one is determined, the probability of finding the binary zero is determined automatically, and vice versa.

In some embodiments, the probability of finding the binary one in the data is determined based upon a coding table and the data distribution of the data set. FIG. 4 is a coding table of three bits coded integers in 2's complement representation, in accordance with some embodiments. In the coding table of FIG. 4, each row is a 2's complement representation of one of the integers (ranging from −4 to 3), and the binary values in each row are the binary values of data bits M[2], M[1], and M[0] for the corresponding represented integer. Here, M[2] is the MSB for the corresponding represented integer, and M[0] is the LSB for the corresponding represented integer.

FIG. 5A is an equation of defining a coding matrix corresponding to the coding table of FIG. 4, in accordance with some embodiments. In FIG. 5A, the coding matrix C is an 8×3 matrix. FIG. 5B is an equation of mapping a column vector X to the column vector $(M[2], M[1], M[0])^T$, in accordance with some embodiments. In FIG. 5B, the column vector X represents one of the integers ranging from −4 to 3, and the column vector $(M[2], M[1], M[0])^T$ represents the binary values of the data bits M[2], M[1], and M[0] in the represented integer, based on the 3×8 matrix $C^T$ which is the transpose of the coding matrix C in FIG. 5A. The column vector $(M[2], M[1], M[0])^T$ is the transpose of the row vector (M[2], M[1], M[0]). FIG. 5C are equations for defining the possible column vector values of the column vector X, in accordance with some embodiments. The column vector X can take any one of the column vector values x(n=−4), x(n=−3), x(n=−2), x(n=−1), x(n=0), x(n=1), x(n=2), and x(n=3). When the column vector X is set to be equal to one of the column vector values in FIG. 5C, the equation of FIG. 5B maps an integer (corresponding to the column vector value at the right side of the equation) to the binary values of the data bits M[2], M[1], and M[0] for representing the integer in 2's complement. For example, when the column vector X is equal to x(n=−3), the equation of FIG. 5B maps the column vector $(0, 1, 0, 0, 0, 0, 0, 0)^T$ to the column vector $(1, 0, 1)^T$, which represents that M[2]=1, M[1]=0, and M[0]=1 for the integer −3 in 2's complement.

When a data for writing into the memory storage is randomly selected from a data that has a data distribution, each of the binary value of the data bits for representing the data also has a corresponding random distribution. In the matrix representation of FIGS. 5A-5C, if the column vector X randomly takes one of the column vector values—such as x(n=−4), x(n=−3), x(n=−2), x(n=−1), x(n=0), x(n=1), x(n=2), or x(n=3), then, the column vector $(M[2], M[1], M[0])^T$ takes a corresponding random vector value as determined by the linear equation $(M[2], M[1], M[0])^T = C^T X$. Both the column vector X and the column vector $(M[2], M[1], M[0])^T$ are random variables. The expected value of the column vector $(M[2], M[1], M[0])^T$ is determined by the expected value E(X) of the column vector X. That is, $$(E(M[2]), E(M[1]), E(M[0]))^T = C^T E(X).$$

Each of the expected values E(M[2]), E(M[1]), and E(M[0]) is related to the corresponding mass distribution function of the data bits M[2], M[1], and M[0]. If the probability of finding the binary one in the data bit M[2] is b[2], then, the probability of finding the binary zero in the data bit M[2] is 1−b[2], and the expected value E(M[2]) is given by the equation $$E(M[2]) = b[2]*1 + (1-b[2])*0 = b[2].$$

Similarly, E(M[1])=b[1], and E(M[0])=b[0], where b[1] is the probability of finding the binary one in the data bit M[1] and b[0] is the probability of finding the binary one in the data bit M[0]. In matrix form, the probability of finding the binary one in the data bits M[2], M[1], and M[0] is given by equation.

$$(b[2], b[1], b[0])^T = C^T E(X).$$

The expected value E(X) is related to the mass distribution function of the column vector X, as expressed by the equation $$E(X) = \Sigma_{i=-4}^{3} p(n=i) * x(n=i),$$

where x(n=i) is the column vector value of the column vector X when integer n=i, and where p(n=i) is the probability of finding integer n=i. In matrix form, the expected value E(X) is given by the equation in FIG. 5D. Thus, the probability of finding the binary one in the data, as expressed as a function of the coding table and the data distribution of the data set, is shown in FIG. 6A. In FIG. 6A, the probability of finding the binary one in the bits M[2], M[1], and M[0] of the coded data are correspondingly equal to b[2], b[1], and b[0]. The probability of finding one of the integers −4, −3, −2, −1, 0, 1, 2, and 3 are correspondingly equal to p(n=−4), p(n=−3), p(n=−2), p(n=−1), p(n=0), p(n=1), p(n=2), and p(n=3).

In FIG. 6B, the column vector $(b[2], b[1], b[0])^T$ is expressed as a result of the finished matrix multiplication between the transpose coding matrix $C^T$ and the expected value E(X) of the column vector X, as shown in the equation of FIG. 6A. The expected number of binary ones is b[2]+b[1]+b[0], and the probability of finding a binary one in a three bits coded integer is (b[2]+b[1]+b[0])/3. After the values of b[2], b[1], and b[0] are substituted with the expressions in FIG. 8B, the probability of finding a binary one, when coded in 2's complement, is given by the equation $$p(\text{binary one})=[1+p(n=-3)+p(n=-2)+2p(n=-1)-p(n=0)+p(n=3)]/3.$$

In some embodiments, if p(binary one)>0.5, the binary one is the majority bit value and the binary zero is the minority bit value, and conversely, if p(binary one)≤0.5, the binary one is the minority bit value and the binary zero is the majority bit value. In some embodiments, if p(binary one) >0.5, the binary one is the majority bit value and the binary zero is the minority bit value, and conversely, if p(binary one)<0.5, the binary one is the minority bit value and the binary zero is the majority bit value. Once the majority bit value and the minority bit value are determined, it becomes possible to set the reliability indicator associated with the data for writing into the memory storage. Based on the reliability indicator, when the data is written into the memory storage, each bit of the data having a bit value identical to the majority bit value is written into a bit cell in the more preferred state, while each bit of the data having a bit value identical to the minority bit value is written into a bit cell in the less preferred state.

In FIG. 7A, the probability p(binary one) of finding a binary one in a three bits coded integer is expressed as a matrix multiplication involving the 1×3 matrix 13, the transpose coding matrix $C^T$, and the 8×1 matrix $p_8(n)$. The 1×3 matrix 13 is defined in FIG. 7B. The 8×1 matrix $p_8(n)$ is defined in FIG. 7C. Each element in the matrix $p_8(n)$ specifies the probability of finding one of the integers in the data set. For example, the element p(n=i) is the probability of finding integer n=i. In the examples as shown in FIGS. 5A-5D and FIGS. 6A-6B, the probability p(binary one) of finding a binary one in a three bits coded integer is calculated for an example transpose coding matrix $C^T$ representing 2's complement encoding. The equation for calculating the probability p(binary one) in FIG. 7A is not only valid for the transpose coding matrix $C^T$ representing 2's complement encoding but also valid for the transpose coding matrix $C^T$ representing other data encoding scheme. Like the transpose coding matrix $C^T$ representing 2's complement encoding which is determined by the coding table in FIG. 4, in some embodiments, the transpose coding matrix $C^T$ representing another data encoding scheme is also determined by a coding table for the corresponding data encoding scheme.

While the equations in FIGS. 7A-7C are applicable for calculating the probability p(binary one) of finding a binary one in a three bits coded integer, the equations in FIGS. 8A-8C are applicable for calculating the probability p(binary one) of finding a binary one in a N bits coded data. Examples of the N bits coded data include an N bits coded integer, an N bits coded float number, and also other kinds of data. The equations in FIGS. 8A-8C are the generalization of the equations in FIGS. 7A-7C. In FIG. 8A, the probability p(binary one) of finding a binary one in a N bits coded data is expressed as a matrix multiplication involving the 1×N matrix $I_N$, the transpose coding matrix $C^T$, and the M×1 matrix $p_M(u)$. Here M is the total number of the data in the data set. The 1×N matrix $I_N$ is defined in FIG. 8B. The M×1 matrix $p_M(u)$ is defined in FIG. 8C. Each element in the matrix $p_M(u)$ specifies the probability of finding one of the data in the data set. For example, the element $p(u=u_i)$ is the probability of finding data $u_i$ in the data set. The equations in FIGS. 7A-7C are special cases of the equations in FIGS. 8A-8C, when the value of N is taken to be 3 and the value of M is taken to be $8=2^3$. Similar to the transpose coding matrix $C^T$ in the equation of FIG. 7A, the data encoding scheme represented by the transpose coding matrix $C^T$ in the equation of FIG. 8A is not limit to 2's complement encoding. Other data encoding schemes represented by the transpose coding matrix $C^T$ for using with the equation of FIG. 8A are within the contemplated scope of the present disclosure.

Figure 9:
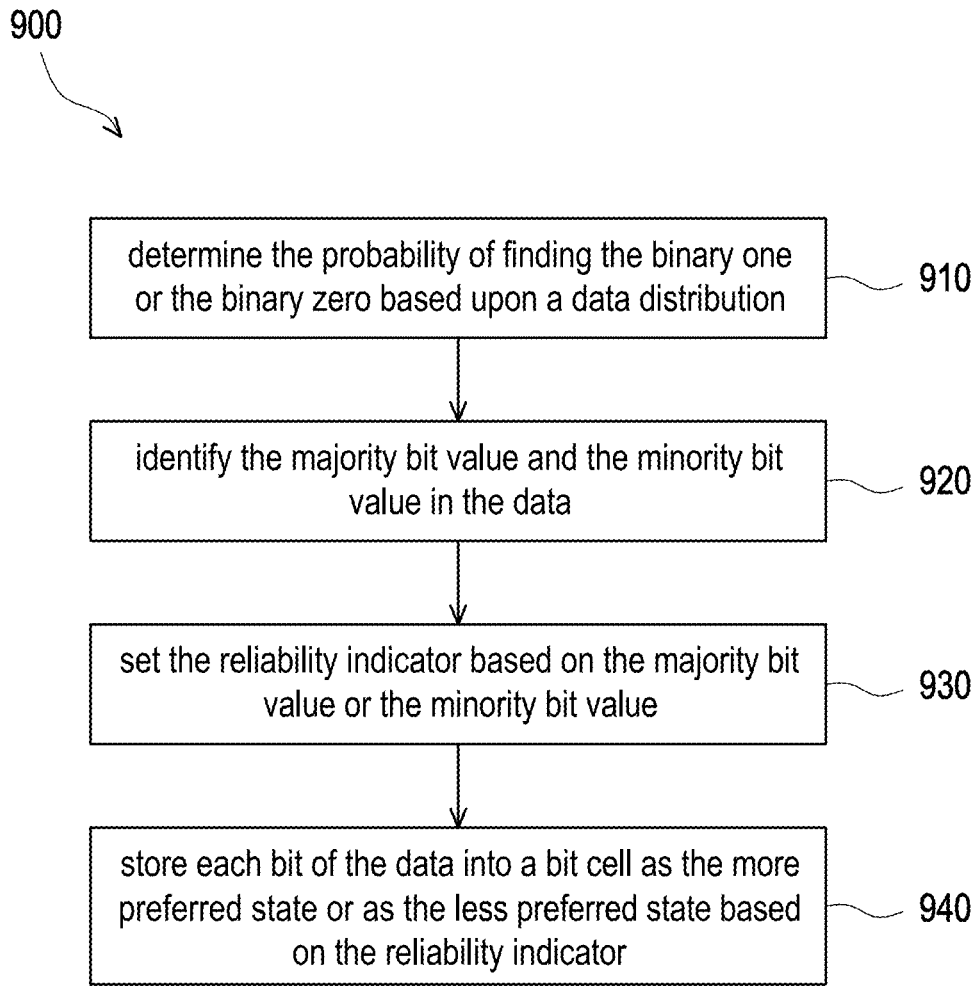
FIG. 9 is a flowchart of a method of storing a data of a data set into a memory storage, in accordance with some embodiments.

FIG. 9 is a flowchart of a method of storing a data in a data set into a memory storage, in accordance with some embodiments. The sequence in which the operations of method 900 are depicted in FIG. 9 is for illustration only; the operations of method 900 are capable of being executed in sequences that differ from that depicted in FIG. 9. It is understood that additional operations may be performed before, during, and/or after the method 900 depicted in FIG. 9, and that other processes may only be briefly described herein.

In operation 910 of method 900, the probability of finding the binary one or the binary zero is determined based upon a data distribution. In some embodiments, based on the equations in FIGS. 5A-5D and FIGS. 6A-6B, the probability of finding a binary one, p(binary one), is determined based on an integer distribution in a data set which includes the integers ranging from −4 to +3. In the equations for calculating p(binary one), the integer distribution is characterized by the probability p(n=i) of finding integer i, where the range of the integers are given by −4≤i≤+3. The probability of finding a binary zero is determined by the equation 1−p (binary one). In some embodiments, the equations in FIGS. 7A-7C or FIGS. 8A-8C used for calculating p(binary one), which is the probability of finding the binary one in a coded data. In some embodiments, the value of p(binary one) is determined by computer simulation, based upon the data distribution of the data set. Following operation 910, in operation 920 of method 900, the majority bit value and the minority bit value in the data are identified. In some embodiments, the majority bit value and the minority bit value are determined based on a comparison between the value of p(binary one) and the value of 1−p(binary one). After operation 920, the process proceeds to operation 930.

In operation 930 of method 900, the reliability indicator is set based on the majority bit value or the minority bit value. In some embodiments, the reliability indicator is set to a first value if the binary one is the majority bit value and the binary zero is the minority bit value, and the reliability indicator is set to a second value if the binary one is the minority bit value and the binary zero is the majority bit value. After operation 930, the process proceeds to operation 940.

In operation 940 of method 900, based on the reliability indicator, each bit of the data is stored into a bit cell as the more preferred state or as the less preferred state. In the example embodiments as shown in FIG. 1A and FIG. 1B, each bit of the data at the write terminal 102 is transmitted to the input 122 of the write driver 120 as an input bit of the input data. In a first example implementation of the write driver 120, the binary one in the input data at the input 122 of the write driver 120 is written into a bit cell and stored in the bit cell as the more preferred state, while the binary zero in the input data at the input 122 of the write driver 120 is written into a bit cell and stored in the bit cell as the less preferred state. In the first example implementation, the reliability indicator is implemented to allow the write path switch 145 to connect the write terminal 102 with the input 122 directly through the first write path 142 if the binary one is the majority bit value, and the reliability indicator is also implemented to allow the write path switch 145 to connect the write terminal 102 with the input 122 through the inverter 144INV in the second write path 144 if the binary zero is the majority bit value.

In a second example implementation of the write driver 120, the binary zero in the input data at the input 122 of the write driver 120 is written into a bit cell and stored in the bit cell as the more preferred state, while the binary one in the input data at the input 122 of the write driver 120 is written into a bit cell and stored in the bit cell as the less preferred state. In the second example implementation, the reliability indicator is implemented to allow the write path switch 145 to connect the write terminal 102 with the input 122 through the inverter 144INV in the second write path 144 if the binary one is the majority bit value, and the reliability indicator is also implemented to allow the write path switch 145 to connect the write terminal 102 with the input 122 directly through the first write path 142 if the binary zero is the majority bit value.

In both the first example implementation and the second example implementation, each bit having the majority bit value of the data received at the write terminal 102 is stored in the memory storage 110 in a bit cell as the more preferred state, and each bit having the minority bit value of the data received at the write terminal 102 is stored in the memory storage 110 in a bit cell as the less preferred state.

Figure 10:
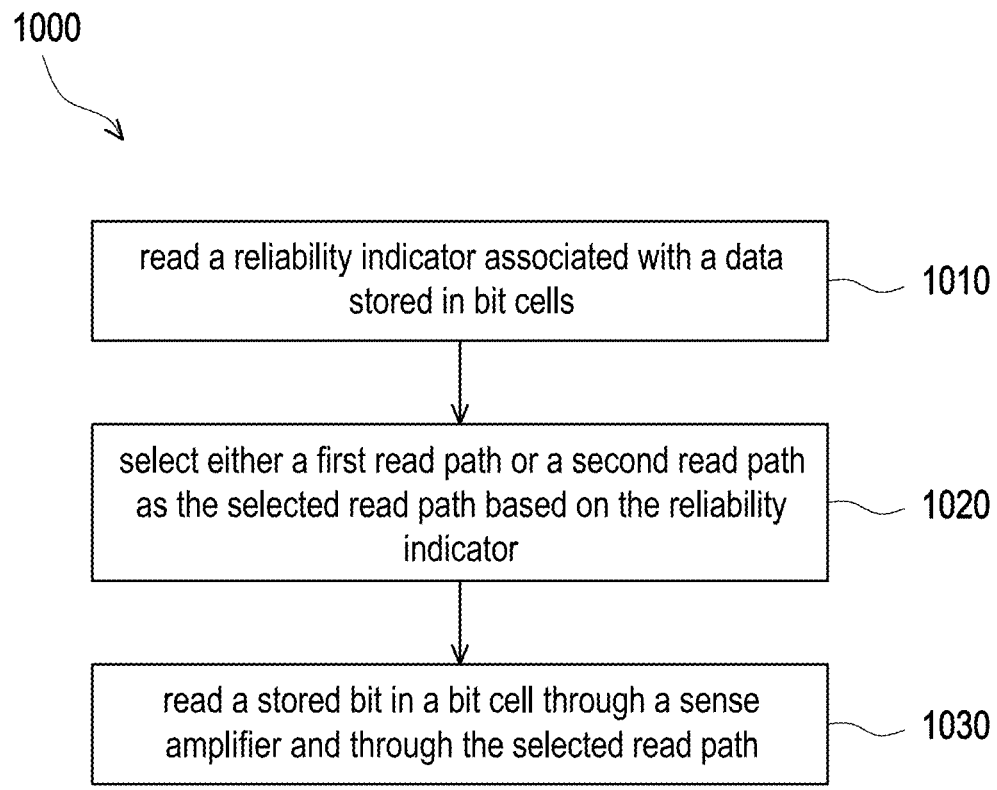
FIG. 10 is a flowchart of a method of reading a stored bit from a memory storage, in accordance with some embodiments.

FIG. 10 is a flowchart of a method 1000 of reading a stored bit from a memory storage, in accordance with some embodiments. The sequence in which the operations of method 1000 are depicted in FIG. 10 is for illustration only; the operations of method 1000 are capable of being executed in sequences that differ from that depicted in FIG. 10. It is understood that additional operations may be performed before, during, and/or after the method 1000 depicted in FIG. 10, and that other processes may only be briefly described herein.

In operation 1010 of method 1000, a reliability indicator associated with a data is read. In the embodiments as shown in FIG. 1A and FIG. 1B, the data are stored in bit cells of the memory storage 110. Each of the bit cells for storing the data has a more preferred state and a less preferred state. In some embodiments, as shown in FIG. 2A, the reliability indicator is implemented as one indicator bit 295 stored in the memory storage 110 as a header before the MSB of the data 290. The indicator bit 295 in the bit stream at the output 168 of the sense amplifier 160 is read and latched into the reliability indicator latch 170. In some embodiments, as shown in FIG. 2B, the reliability indicator is implemented as two indicator bits 295A and 295B stored in the memory storage 110 as a header before the MSB of the data 290. The indicator bits 295A and 295B in the bit stream at the output 168 of the sense amplifier 160 are read and latched into the reliability indicator latches 170A and 170B.

In operation 1020 of method 1000, based on the reliability indicator, either a first read path or a second read path is selected as the selected read path. In the embodiments as shown in FIGS. 1A and 2A, the read path switch 185 is configured to select either the first read path 182 or the second read path 184 as the selected read path based on the reliability indicator, and the selected read path connects the output 168 of the sense amplifier 160 with the read terminal 108. In FIGS. 1A-1B, the reliability indicator is implemented as one indicator bit 295, and the read path switch 185 for selecting the read path is controlled by the latched bit value of the indicator bit 295. In FIGS. 2A-2B, the reliability indicator is implemented as two indicator bits 295A and 295B, and the read path switch 185 for selecting the read path is controlled by the latched bit value of the indicator bit 295A and the latched bit value of the indicator bit 295B.

In operation 1030 of method 1000, a stored bit in a bit cell is read through a sense amplifier and through the selected read path. In the embodiments as shown in FIGS. 1A and 2A, the stored bit in the memory storage 110 is read through the sense amplifier 160, and a sensed bit is generated at the output 168 of the sense amplifier 160. When the first read path 182 is the selected read path, the sensed bit generated at the output 168 is outputted to the read terminal 108 as an output bit through the electric conductor connected from the output 168 to the read terminal 108. When the second read path 184 is the selected read path, the sensed bit generated at the output 168 is outputted to the read terminal 108 as an output bit through the inverter 184INV between the output 168 of the sense amplifier 160 and the read terminal 108.

In methods 900 and 1000, if a data has more binary one bits than binary zero bits, then the binary one bits are stored with the more preferred state and the binary zero bits are stored with the less preferred state. Conversely, if a data has less binary one bits than binary zero bits, then the binary one bits are stored with the less preferred state and the binary zero bits are stored with the more preferred state. When a bit having the majority bit value is stored into a bit cell with the more preferred state and a bit having the minority bit value is stored into a bit cell with the less preferred state, the retention errors in the bit cells are reduced.

An aspect of the present disclosure relates to a method of storing a data of a data set into a memory storage having bit cells. A bit cell has a more preferred state and a less preferred state. The method includes determining a probability of finding a binary one in the data or determining a probability of finding the binary zero in the data. The method also includes identifying each of the binary one and the binary zero as either a majority bit value or a minority bit value in the data based on the probability of finding the binary one in the data or based on the probability of finding the binary zero in the data. A probability of finding a majority bit value in the data is larger than a probability of finding a minority bit value in the data. The method further includes storing a bit of the data into a bit cell based upon whether the bit of the data has the majority bit value or the minority bit value. The bit of the data is stored into the bit cell as the more preferred state if the bit of the data has the majority bit value and the bit of the data is stored into the bit cell as the less preferred state if the bit of the data has the minority bit value.

Another aspect of the present disclosure relates to a method. The method includes reading a reliability indicator associated with a data stored in bit cells, each bit cell having a more preferred state and a less preferred state. The method also includes reading a stored bit in a bit cell through a sense amplifier and through either a first read path or a second read path selected based on the reliability indicator. In the method, the sense amplifier is configured to generate a sensed bit from the stored bit, the first read path is configured to generate a first output bit from the sensed bit when the first read path is selected, and the second read path is configured to generate a second output bit from the sensed bit when the second read path is selected. In the method, the first output bit generated from the sensed bit if the first read path is selected is configured to be a bitwise complement of the second output bit generated from the sensed bit if the second read path is selected.

Another aspect of the present disclosure relates to an integrated circuit. The integrated circuit includes a memory storage having bit cells, a write path switch, a write terminal configured to receive a data of a data set, and a write driver. In the integrated circuit, a bit cell has a more preferred state and a less preferred state. The write path switch is configured to have a connection state determined by a reliability indicator. The write driver has an input configured to receive an input data from the write terminal through either a first write path or a second write path as determined by the connection state of the write path switch. The write driver is operative to write an input bit of the input data into the bit cell as a stored bit. The input data received through the first write path is configured to be equal to the data at the write terminal, and the input data received through the second write path is configured to be a bitwise complement of the data at the write terminal. In the integrated circuit, the reliability indicator is configured to be set based on a majority bit value in the data or based on a minority bit value in the data.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of storing a data of a data set into a memory storage having bit cells, wherein a bit cell has a more preferred state and a less preferred state, the method comprising:
   determining a probability of finding a binary one in the data or determining a probability of finding a binary zero in the data;
   identifying each of the binary one and the binary zero as either a majority bit value or a minority bit value in the data based on the probability of finding the binary one in the data or based on the probability of finding the binary zero in the data, wherein a probability of finding a majority bit value in the data is larger than a probability of finding a minority bit value in the data; and
   storing a bit of the data into a bit cell based upon whether the bit of the data has the majority bit value or the minority bit value, wherein the bit of the data is stored into the bit cell as the more preferred state if the bit of the data has the majority bit value and the bit of the data is stored into the bit cell as the less preferred state if the bit of the data has the minority bit value.

2. The method of claim 1, further comprising:
   determining the probability of finding the binary one in the data or the probability of finding the binary zero in the data based upon a data distribution of the data set.

3. The method of claim 1, further comprising:
   determining the probability of finding the binary one in the data or the probability of finding the binary zero in the data based upon a most significant bit in the data.

4. The method of claim 1, further comprising:
   determining a reliability indicator based upon whether the binary one or the binary zero is the majority bit value, or based upon whether the binary one or the binary zero is the minority bit value.

5. The method of claim 4, wherein storing the bit of the data comprises:
   storing the bit of the data into the bit cell as the more preferred state through a first write path if the reliability indicator is a first value, and storing the bit of the data into the bit cell as the less preferred state through a second write path if the reliability indicator is a second value that is different from the first value.

6. The method of claim 4, further comprising:
   setting the reliability indicator to a first value if the binary one is the majority bit value and the binary zero is the minority bit value, and setting the reliability indicator to a second value different from the first value if the binary one is the minority bit value and the binary zero is the majority bit value.

7. The method of claim 6, wherein the reliability indicator includes an indicator bit, and wherein the first value is a first binary value and the second value is a bitwise complement of the first binary value.

8. The method of claim 6, wherein the reliability indicator includes two indicator bits.

9. The method of claim 1, wherein the majority bit value is the binary one, and wherein storing the bit of the data comprises:
   storing the bit of the data into the bit cell as the more preferred state if the bit of the data is the binary one, and storing the bit of the data into the bit cell as the less preferred state if the bit of the data is the binary zero.

10. The method of claim 1, wherein the majority bit value is the binary zero, and wherein storing the bit of the data comprises:
    storing the bit of the data into the bit cell as the more preferred state if the bit of the data is the binary zero, and storing the bit of the data into the bit cell as the less preferred state if the bit of the data is the binary one.

11. A method of storing a data of a data set into a memory storage having bit cells, wherein a bit cell has a more preferred state and a less preferred state, the method comprising:
    determining a probability of finding a binary one in the data or determining a probability of finding a binary zero in the data;
    determining a reliability indicator based upon whether the binary one or the binary zero is a majority bit value, or based upon whether the binary one or the binary zero is a minority bit value, wherein a probability of finding a majority bit value in the data is larger than a probability of finding a minority bit value in the data; and
    storing the bit of the data into the bit cell as the more preferred state through a first write path if the reliability indicator is a first value, and storing the bit of the data into the bit cell as the less preferred state through a second write path if the reliability indicator is a second value that is different from the first value.

12. The method of claim 11, further comprising:
    determining the probability of finding the binary one in the data or the probability of finding the binary zero in the data based upon a data distribution of the data set.

13. The method of claim 11, further comprising:
    setting the reliability indicator to a first value if the binary one is the majority bit value and the binary zero is the minority bit value, and setting the reliability indicator to a second value different from the first value if the binary one is the minority bit value and the binary zero is the majority bit value.

14. The method of claim 13, wherein the reliability indicator includes an indicator bit, and wherein the first value is a first binary value and the second value is a bitwise complement of the first binary value.

15. The method of claim 13, wherein the reliability indicator includes two indicator bits.

16. The method of claim 11, wherein the majority bit value is the binary one, and wherein storing the bit of the data comprises:
   storing the bit of the data into the bit cell as the more preferred state if the bit of the data is the binary one, and storing the bit of the data into the bit cell as the less preferred state if the bit of the data is the binary zero.

17. The method of claim 11, wherein the majority bit value is the binary zero, and wherein storing the bit of the data comprises:
   storing the bit of the data into the bit cell as the more preferred state if the bit of the data is the binary zero, and storing the bit of the data into the bit cell as the less preferred state if the bit of the data is the binary one.

18. A method of storing a data of a data set into a memory storage having bit cells, wherein a bit cell has a more preferred state and a less preferred state, the method comprising:
   storing a reliability indicator as a first value if a binary one is a majority bit value and a binary zero is a minority bit value, and storing the reliability indicator as a second value different from the first value if the binary one is the minority bit value and the binary zero is the majority bit value; and
   storing the bit of the data into the bit cell as the more preferred state through a first write path if the reliability indicator has the first value, and storing the bit of the data into the bit cell as the less preferred state through a second write path if the reliability indicator has the second value that is different from the first value.

19. The method of claim 18, wherein the reliability indicator includes an indicator bit, and wherein the first value is a first binary value and the second value is a bitwise complement of the first binary value.

20. The method of claim 18, wherein the reliability indicator includes two indicator bits.

* * * * *